United States Patent
Akimoto

Patent Number: 6,159,420
Date of Patent: Dec. 12, 2000

[54] GOLD ALLOY WIRE AND METHOD FOR MAKING A BUMP

[75] Inventor: Hideyuki Akimoto, Mitaka, Japan

[73] Assignee: Tanaka Denshi Kogyo K.K., Tokyo, Japan

[21] Appl. No.: 08/863,034

[22] Filed: May 23, 1997

[30] Foreign Application Priority Data

May 28, 1996 [JP] Japan ................................ 8-133546

[51] Int. Cl.$^7$ .................................................. C22C 5/02
[52] U.S. Cl. ............................................. 420/508; 148/430
[58] Field of Search .............................. 420/508; 148/430

[56] References Cited

U.S. PATENT DOCUMENTS

| | | | |
|---|---|---|---|
| 4,330,329 | 5/1982 | Hayashi et al. | 420/511 |
| 4,702,302 | 10/1987 | Sawada | 164/463 |
| 4,938,923 | 7/1990 | Kujiraoka et al. | 420/509 |
| 5,071,619 | 12/1991 | Hosoda et al. | 420/507 |

FOREIGN PATENT DOCUMENTS

| | | |
|---|---|---|
| 48-7678 | 1/1973 | Japan. |
| 56-49535 | 5/1981 | Japan. |
| 59-208751 | 11/1984 | Japan. |
| 61-52961 | 3/1986 | Japan. |
| 62-152143 | 7/1987 | Japan. |
| 63-145729 | 6/1988 | Japan. |
| 2-91944 | 3/1990 | Japan. |
| 6-112251 | 4/1994 | Japan. |
| 6-112253 | 4/1994 | Japan. |
| 6-112255 | 4/1994 | Japan. |
| 7-070671 | 3/1995 | Japan ................................ 420/507 |
| 7-70672 | 3/1995 | Japan. |
| 7-335684 | 12/1995 | Japan. |
| 8-109424 | 4/1996 | Japan. |
| 8-127828 | 5/1996 | Japan. |
| 8-193233 | 7/1996 | Japan. |
| 8-325657 | 12/1996 | Japan. |
| 8-325658 | 12/1996 | Japan. |
| 9-64082 | 3/1997 | Japan. |

*Primary Examiner*—George Wyszomierski
*Attorney, Agent, or Firm*—Christie, Parker & Hale, LLP

[57] ABSTRACT

A gold alloy wire in which 0.2 to 5.0% by weight of palladium (Pd) and 1 to 100 ppm by weight of bismuth (Bi) are added to gold having a purity of at least 99.99% by weight. Preferably, at least one element selected from the group consisting of yttrium (Y), lanthanum (La), calcium (Ca) and beryllium (Be) in an amount of 3 to 250 ppm by weight is further added to said gold. The gold alloy wire is especially adapted to forming a gold bump.

10 Claims, 3 Drawing Sheets

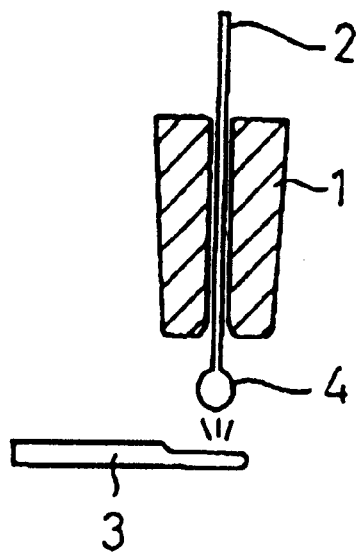
Fig.1A
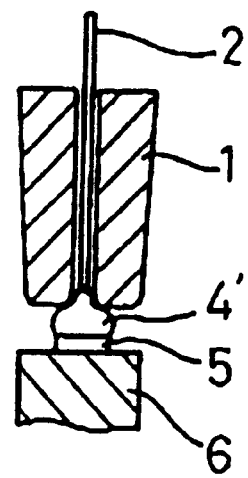
Fig.1B
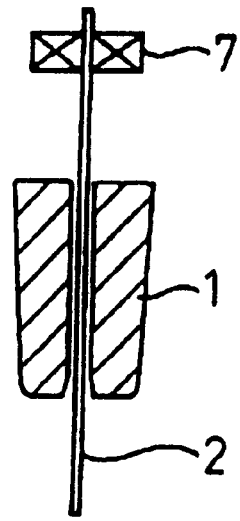
Fig.1C
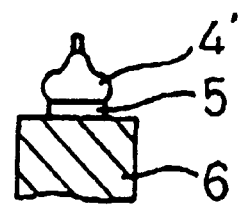

GOLD ALLOY WIRE AND METHOD FOR MAKING A BUMP

BACKGROUND OF THE INVENTION

1. Field of the Invention

The present invention relates to a gold alloy wire, particularly for forming a gold alloy bump in wireless bonding of IC chips, and a method for forming such a gold alloy bump.

2. Description of the Related Art

A wire bonding method is used to connect electrode pads of an IC chip with outer terminals and the like through wires.

A semiconductor device obtained by the wire bonding method is shown in FIG. 5, in which 11 denotes a semiconductor element, 12 an electrode, 13 a gold alloy wire, 14 a lead frame, and H a height of the loop from the top surface of the semiconductor element (hereinafter referred to as "loop height"). Generally, the wire 13 is first bonded to the electrode 12 of the semiconductor element 11, is then arranged into the loop shape, and bonded to the lead frame 14 by ultrasound bonding.

The wire bonding method requires a substantial loop height which makes it difficult to reduce the height of a semiconductor device.

It is therefore desired that the loop height is reduced in the wire bonding method.

Secondly, to remove the above defect in the wire bonding method, the wireless bonding method is known in which outer terminals or electrodes of a circuit board are bonded to bumps formed on the electrode pads of an IC chip. In this wireless bonding method, the height for the connection can be reduced in comparison with the wire bonding method since the electrode pads are directly bonded to the outer terminals or the like with the bumps therebetween. Thus, the wireless bonding method is advantageous in application to thinner packages.

The methods for forming bumps on electrode pads are disclosed in Japanese Unexamined Patent Publication Nos. 48-7678 and 59-208751 and others. These methods comprise heating an end of a wire to form a fused ball, pressing and bonding the fused ball to the electrode pad of the IC chip by means of a pressing jig, pulling the pressing jig with the wire upward to break the wire at a portion of the wire close to the ball, by which a bump is formed on the electrode pads. These methods allow use of an apparatus for the conventional wire bonding method without any change and are excellent in productivity, but are disadvantageous in that the length of the wire left on the ball, so-called tail length, cannot be uniformly short. If the tail length is long, at the connection is step, the tail on the bump is bent to protrude transversely, so that a short circuit may be caused.

To solve the above problem, Japanese Unexamined Patent Publication No. 62-152143 discloses a method in which after the ball is pressed and bonded to the electrode pad, a notch is provided to the wire at a location close to the ball by means of a cutting jig, after which the wire is pulled to stably obtain a bump with a short tail. This method allows to stably obtain a bump with a short tail but an additional step is required and the productivity is low.

The preferable material for forming a bump is gold and the preferable material for forming an electrode pad is aluminum. It is, however, known that when the ball formed by heating an end of the gold wire is pressed and bonded to the aluminum electrode pad, an Au—Al intermetal alloy is formed at the connection portion between the gold ball and the aluminum pad. When the connecting portion is held at a high temperature, the amount of the Au—Al intermetal alloy increases and the bond strength at the connecting portion decreases. Therefore, provision of an improved bump material for bonding electrode pads with outer terminals, etc. is demanded.

An object of the present invention is to provide a gold alloy wire which allows a high bond strength even after a bump on an electrode pad is exposed to a high temperature for a long time (hereinafter called a "high temperature bond strength"), and a method for making a bump using such a wire.

Another object of the invention is to provide a gold alloy wire which stably provides a short tail when the wire is used in a method in which a fused ball is formed at an end of the wire, the ball is bonded onto an electrode pad of an IC chip, and the wire is pulled upward to break without a notch on the wire (hereinafter called a "simple pull-derived tail").

A further object of the invention is to provide a gold alloy wire which allows reduction of the loop height when wire bonding is conducted.

SUMMARY OF THE INVENTION

The present inventors vigorously investigated and found that the above objects can be attained by an synergistic effect of the elements palladium (Pd) and bismuth (Bi) added to a high purity gold.

Thus the above and other objects, and the features and advantages of the present invention, are attained by providing a gold alloy wire in which 0.2 to 5.0% by weight of palladium (Pd) and 1 to 100 ppm by weight of bismuth (Bi) are added to gold having a purity of at least 99.99% by weight.

It is preferable that the above gold alloy wire further comprises at least one element selected from the group consisting of yttrium (Y), lanthanum (La), calcium (Ca) and beryllium (Be) in an amount of 3 to 250 ppm by weight.

The present invention also provides a method for forming a gold alloy bump, comprising the steps of forming a ball at an end of a gold alloy wire passing through a capillary, lowering said capillary to press and bond said ball to an electrode of an IC chip, and pulling said gold alloy wire upward to break said gold alloy wire from said ball bonded to said electrode, to thereby form a gold alloy bump on said electrode of said IC chip, wherein said gold alloy wire has a composition in which 0.2 to 5.0% by weight of palladium (Pd) and 1 to 100 ppm by weight of bismuth (Bi), and further preferably 3 to 250 ppm by weight of at least one element selected from the group consisting of yttrium (Y), lanthanum (La), calcium (Ca) and beryllium (Be), are added to gold having a purity of at least 99.99% by weight.

The present invention also provides a method for forming a gold alloy bump, comprising the steps of forming a ball at an end of a gold alloy wire passing through a capillary, lowering said capillary to press and bond said ball to an electrode of an IC chip, making a notch to said gold alloy wire above said ball, and pulling said gold alloy wire upward to break said gold alloy wire from said ball bonded to said electrode, to thereby form a gold alloy bump on said electrode of said IC chip, wherein said gold alloy wire has a composition in which 0.2 to 5.0% by weight of palladium (Pd) and 1 to 100 ppm by weight of bismuth (Bi), and further preferably 3 to 250 ppm by weight of at least one element selected from the group consisting of yttrium (Y), lanthanum (La), calcium (Ca) and beryllium (Be), are added to gold having a purity of at least 99.99% by weight.

The gold alloy wire of the present invention is useful not only in wireless bonding but also in wire bonding.

BRIEF DESCRIPTION OF THE DRAWINGS

FIGS. 1A, 1B, and 1C show the method for forming a bump by simply pulling a wire;

DESCRIPTION OF THE PREFERRED EMBODIMENTS

Figure 2A:
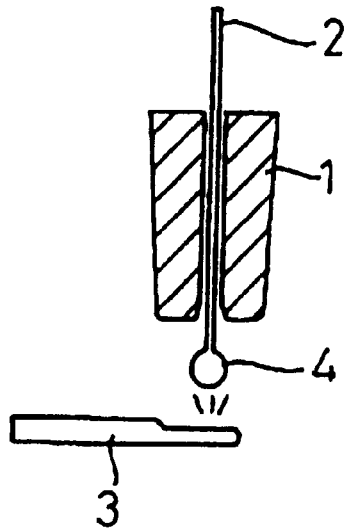
FIGS. 2A, 2B, 2C and 2D show the method for forming a bump by pulling a notched wire.

The gold alloy wire of the present invention is characterized by having a composition in which prescribed amounts of Pd and Bi (hereinafter referred to as "the first group of elements"), preferably together with a prescribed amount of at least one element of Y, La, Ca and Be (hereinafter referred to as "the second group of elements") are added to a high purity gold.

The high purity gold used in the present invention is a high purity gold having a purity of at least 99.99% by weight, preferably at least 99.995% by weight, particularly at least 99.999% by weight.

1) By adding Pd and Bi in the amounts specified in accordance with the present invention to the above high purity gold, an synergistic effect is obtained such that a high temperature bond strength may be maintained high and the length of a simple pull-derived tail may be stably made short.

Addition of Pd in the co-presence of Bi provides an excellent effect in that a high temperature bond strength may be maintained high and the length of a simple pull-derived tail may be made uniformly short. If the content of Pd is less than 0.2% by weight, the high temperature bond strength is lower than and the length of the simple pull-derived tail is longer than those obtainable when the content of Pd is 0.2% by weight or more, even if said prescribed amount of Bi is co-present. If the content of Pd is more than 5.0% by weight, the length of the simple pull-derived tail is longer than that obtainable when the content of Pd is 5.0% by weight or less, even if said prescribed amount of Bi is co-present. Therefore, the content of Pd is specified to 0.2 to 5.0% by weight in co-presence of the prescribed content of Bi.

Addition of Bi in the co-presence of Pd provides an excellent effect in that a high temperature bond strength may be kept high and the length of a simple pull-derived tail may be made uniformly short. If the content of Bi is less than 1 ppm by weight, the length of the simple pull-derived tail is longer and less uniform than that obtainable when the content of Bi is 1 ppm by weight or more, even if said prescribed amount of Pd is co-present. If the content of Bi is more than 100 ppm by weight, even if said prescribed amount of Pd is co-present, pinholes appear on the surface of the ball, at a stage of forming the ball before forming the bump, more frequently than when the content of Bi is 100 ppm by weight or less. Therefore, the content of Bi is specified to 1 to 100 ppm by weight in co-presence of the prescribed content of Pd. A preferable content of Bi in co-presence of the prescribed content of Pd is 1 to 40 ppm by weight.

Thus, in accordance with the present invention, the effects of maintaining a high temperature bond strength and stably forming a short simple pull-derived tail can be obtained.

2) The above effects are basically obtainable in the above alloy wire even if other elements are further added to the alloy wire. Generally, the above effects obtained by adding the prescribed amounts of Pd and Bi are not lost if the total content of the elements other than Pd and Bi added to the wire is not more than 250 ppm by weight.

Thus, the effects of the present invention is generally maintained even if additional elements other than Pd and Bi are added, but particularly if at least one of Y, La, Ca and Be is added in an amount in a range of 3 to 250 ppm by weight, the effect of stably obtaining a short simple pull-derived tail is equivalent and the effect of obtaining a high temperature bond strength is improved. This additional effect may be obtained by adding any one of Y, La, Ca and Be and therefore each one of these elements is a preferable additive element. More preferably, at least three elements of these four elements are added. Most preferably, at least three elements including Y, La and Ca are added in which case the effect of a high temperature bond strength is then improved further. A preferable amount of the at least one element of the second group is 3 to 70 ppm by weight.

Here, even if one or more element of the second group is added to the wire but the prescribed amounts of the elements of the first group are not added, the simple pull-derived tail length and the high temperature bond strength are improved. However, if the one or more element of the second group is added to the gold alloy wire in the presence of the prescribed amounts of the elements of the first group, the length and uniformity of the simple pull-derived tail and the high temperature bond strength are more excellent. If the one or more element of the second group is added and the prescribed amount of Bi from the first group elements is added but the prescribed amount of Pd from the first group elements is not added, the effects of improving a high temperature bond strength and a short simple pull-derived tail length are not sufficient. Accordingly, the prescribed amount of Pd should be co-present if the prescribed amount of Bi is added. Thus, in accordance with the present invention, it is stated that the element(s) of the second group, i.e., at least one of Y, La, Ca and Be should be co-present with the prescribed amounts of Pd and Bi and the amount thereof should be in an amount of 3 to 250 ppm by weight, preferably 3 to 70 ppm by weight.

It should be noted that the gold alloy wire of the present invention may consist of 0.2 to 5.0% by weight of palladium (Pd) and 1 to 100 ppm by weight of bismuth (Bi), and further preferably 3 to 250 ppm by weight of at least one element selected from the group consisting of yttrium (Y), lanthanum (La), calcium (Ca) and beryllium (Be), with the remainder being gold and inevitable impurities.

In accordance with the present invention, a method for forming a bump using the gold alloy wire as described above is also provided.

3) Simple pulling method

The simple pulling method is described with reference to FIGS. 1A to 1C.

As shown in FIG. 1A, the gold alloy wire of the present invention 2 is passed through a capillary 1, an electric torch 3 faces an end of the wire 2 and an electric discharge is effected between the electric torch 3 and the end of the wire 2 to heat the end of the wire and form a fused ball 4.

As shown in FIG. 1B, the capillary 1 is lowered to press and bond the ball to the electrode 5 on an IC chip 6. Although not shown in the figure, since ultrasound is simultaneously applied to the ball 4 through the capillary 1 and the IC chip 6 is heated by a heater block, the ball 4 is thermally bonded so that the ball 4 is deformed into a two-step flat shape 4'.

As shown in FIG. 1C, the capillary 1 is pulled upward while the damper 7 holds the gold alloy wire 2. As a result, the wire 2 is broken and separated from the deformed ball 4' to leave a bump 4', i.e., the ball pressed and bonded to the electrode 5 of the IC chip 6.

After that, the top of the bump 4' is connected to an outer terminal (not shown).

Figure 3:
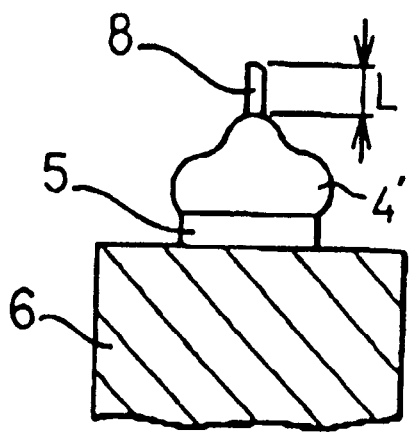
FIG. 3 is an enlarged view of the bump portion in FIG. 1C.

Here, as shown in FIG. 1C, a wire portion remains on the top of the bump 4'. FIG. 3 is an enlarged figure of this bump 4'. The tail length used in the present invention is referred to the length L of the wire piece 8 remaining on the bump 4'.

When a bump is formed by this simple pulling method and the gold alloy wire is used in accordance with the present invention, the length of the tail (the simple pull-derived tail) can be uniformly short.

4) Notched pulling method

The notched pulling method is described with reference to FIGS. 2A, 2B, 2C, 2D.

Figure 2B:
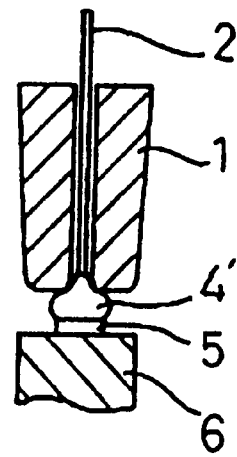

As shown in FIGS. 2A and 2B, a ball 4 is pressed and bonded to the electrode 5 on the IC chip 6 and deformed into the two-step flat or mount shape, in the same manner as described before with reference to FIGS. 1A and 1B.

Figure 2C:
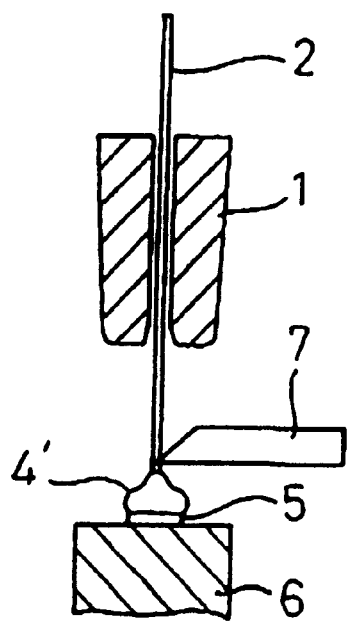
Figure 4:
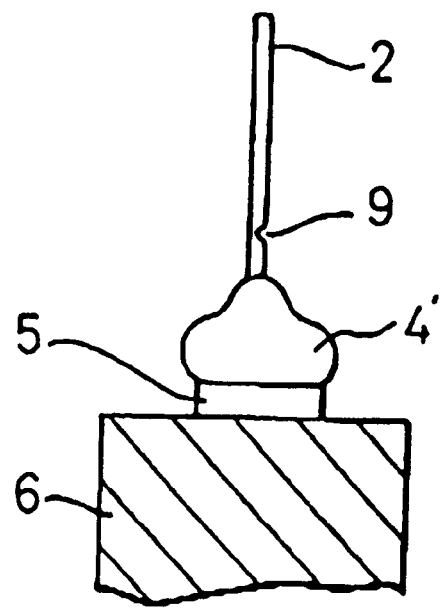
FIG. 4 is an enlarged view of the notch portion in FIG. 2B'.
Figure 5:
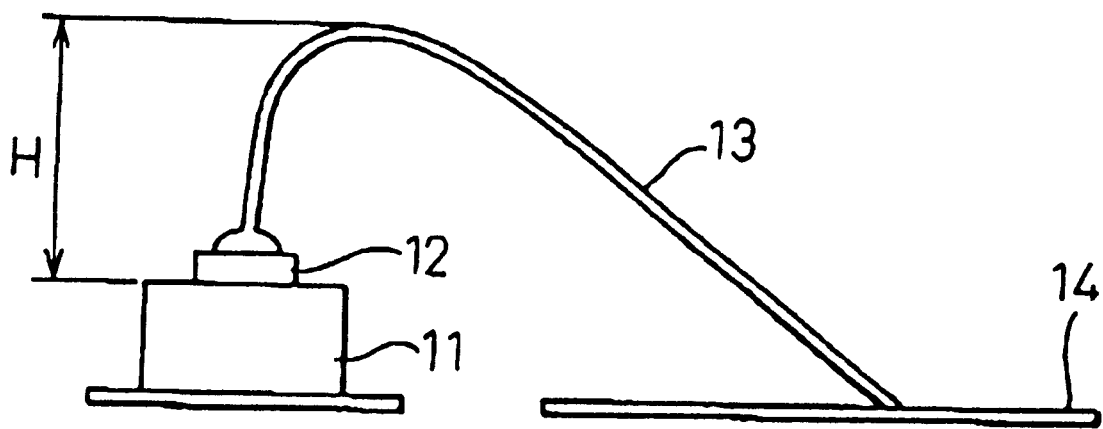
FIG. 5 shows a semiconductor device in which wire bonding is made.

As shown in FIG. 2C, a sharp edge of a notch-forming jig 7 approaches, from the side, the gold alloy wire 2 at a desired location above the two-step flat or mount shape 4' to form a notch or recess. FIG. 4 is an enlarged figure of this stage, in which a notch or recess 9 is shown. The shape of the notch or recess 9 is not limited to a V-shape.

Figure 2D:
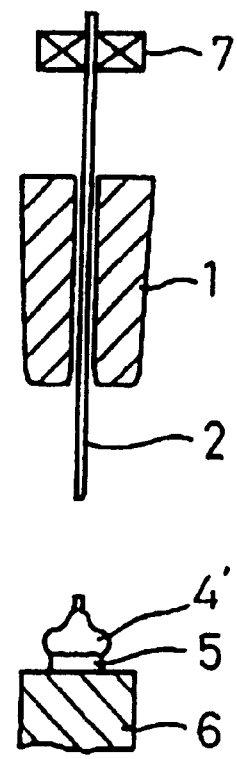

Then as shown in FIG. 2D, the wire 2 is pulled upward in the same manner as in FIG. 1C, so that the wire 2 is broken or cut from the bonded ball 4' and a bump 4' on the electrode 5 of the IC chip 6 is thus formed.

The top of the bump 4' is then connected to an outer terminal, although it is not shown.

In this case, a wire piece 8 is left on the bump 4'.

This notched pulling method is preferable since the tail length may be controlled to a desired length by setting the location of the notch.

An electrically conductive material may be used for connecting the bump 4' with the outer terminal.

EXAMPLES

Example 1

A mixture of a high purity gold having a purity of 99.999% by weight with prescribed amounts of Pd and Bi was melted in a vacuum furnace and cast to obtain a gold alloy ingot having a composition as shown in Table 1, that is, 0.2% by weight of Pd and 20 ppm by weight of Bi. The ingot was cold worked by a groove roller drawing machine and intermediately annealed to obtain a final wire diameter of 25 $\mu$m. The wire was finally annealed to have an elongation of 2 to 3%.

This gold alloy wire was bonded onto electrodes of an IC chip with a wire bonding machine by an ultrasound thermal pressing bonding method in the manner as shown in FIGS. 1A to 1C. The bonded wires were then simply pulled upward to form ten bumps.

The obtained bumps were examined by measuring the tail length and carrying out a high temperature bond test followed by observation of the appearance of the bump or ball. The results are shown in Table 1.

Examples 2 to 41 and Comparative Examples 1 to 9

The same procedures and examinations as in Example 1 were conducted except that the compositions of the wire were made as shown in Tables 1 to 3.

(Methods for Measurement)

1) Tail Length

The tail length of ten samples for each of Examples and Comparative Examples was measured by a length-measuring microscope. The average length and standard deviation were calculated.

2) High Temperature Bond Strength

Ten samples for each of Examples and Comparative Examples were placed in a thermostatic furnace set to 300° C. for 500 hours, followed by measuring the shearing strength by a shearing strength measuring machine. The average value of the shearing strength was taken as the high temperature bond strength.

3) Appearance of Ball

The appearance of the ball when it was formed was observed by a microscope to determine if there were pinholes on the outer surface of the ball. When pinholes were seen, the result was considered bad. When no pinhole was seen, the result was considered good. In Tables, "good" is shown by o, and "bad" is shown as x.

(Results of the Tests and Examinations)

1) In Examples 1 to 6 in which the prescribed amounts of Pd and Bi (first group of elements) were added to the gold, the following excellent results were obtained:
   i) The average tail length was in a range of 33.4 to 39.6 $\mu$m, and the standard deviation of the tail length which expresses the non-uniformity of the tail length was in a range of 5.0 to 8.8 $\mu$m. The length of the tail was short and uniform.
   ii) The high temperature bond strength was as high as in a range of 42.1 to 56.2 gf.
   iii) Pinholes were not observed in any Examples.

2) In Examples 7 to 41 in which the prescribed amount(s) of at least one of Y, La, Ca and Be (second group of elements) in addition to the prescribed amounts of Pd and Bi (first group of elements) were added to the gold, the following excellent effects were exhibited. Particularly, the high temperature bond strength was more excellent than in the case of addition of only the first group of element(s).
   i) The average tail length was in a range of 31.1 to 37.6 μm, and the standard deviation of the tail length which expresses the non-uniformity of the tail length was in a range of 4.4 to 9.9 μm. The length of the tail was short and uniform.
   ii) The high temperature bond strength was as high as in a range of 42.8 to 67.4 gf.
   iii) The high temperature bond strength was further improved by adding the element(s) of the second group.
      a) When comparing Example 1 with Examples 7, 13 and 19 in which the element(s) of the second group was/were further added to Example 1, the high temperature bond strength was improved from 42.1 gf to a range of 42.8 to 43.3 gf.
      b) When comparing Examples 2 to 6 with corresponding Examples in which the element(s) of the second group was/were further added to Examples 2 to 6, the high temperature bond strength was similarly improved.
   iv) Pinholes were not observed in any Examples.
   v) In Examples 40 to 41 in which three or more elements of the second group were added, the high temperature bond strength was the most excellent, as 67.2 to 67.4 gf.
3) In Comparative Example 1 in which either of the elements of the first or of second groups were not added, the average tail length was 75.2 μm, and the standard deviation of the tail length was 32.3 μm. The high temperature bond strength was 5.2 gf. These results were bad.
4) In Comparative Examples 2, 3, 7 and 8 in which the prescribed amount of Bi was added and Pd was added in an amount less than 0.2% by weight, the average tail length was 46.0 to 50.9 μm, the standard deviation of the tail length was 8.3 to 12.7 μm, and the high temperature bond strength was 13.5 to 16.4 gf. These results were bad.
5) In Comparative Example 4 in which the prescribed amount of Bi was added and Pd was added in an amount beyond 5.0% by weight, the average tail length was 58.9 μm, and the standard deviation of the tail length was 14.4 μm. These results were bad.
6) In Comparative Examples 5 and 9 in which the prescribed amount of Pd was added and Bi was not added, the standard deviation of the tail length was bad at 19.5 to 21.4 μm. The high temperature bond strength was 33.2 to 36.8 gf, improved in comparison with Comparative Example 1, but inferior to Examples of the present invention.
7) In Comparative Example 6 in which the prescribed amount of Pd was added and Bi was added in an amount beyond 100 ppm by weight, pinholes were observed. The high temperature bond strength was low and the deviation was large and, therefore, the numerical values thereof are not shown in Tables.

TABLE 1

| | Test conditions Composition | | | | | | | Test results | | |
| | wt % | wt ppm | | | | | | Tail length (μm) | | High temperature bond strength (gf) | Ball appearance |
| | Pd | Bi | Y | La | Ca | Be | Au | Average | Standard deviation | | |
|---|---|---|---|---|---|---|---|---|---|---|---|
| Ex. 1 | 0.2 | 20 | — | — | — | — | remainder | 38.2 | 6.6 | 42.1 | ○ |
| Ex. 2 | 0.5 | 20 | — | — | — | — | remainder | 33.4 | 5.2 | 55.8 | ○ |
| Ex. 3 | 1.0 | 20 | — | — | — | — | remainder | 33.5 | 5.0 | 56.2 | ○ |
| Ex. 4 | 5.0 | 20 | — | — | — | — | remainder | 36.3 | 5.0 | 55.0 | ○ |
| Ex. 5 | 1.0 | 1 | — | — | — | — | remainder | 39.6 | 8.8 | 46.8 | ○ |
| Ex. 6 | 1.0 | 100 | — | — | — | — | remainder | 37.4 | 5.2 | 47.3 | ○ |
| Ex. 7 | 0.2 | 20 | 10 | — | — | — | remainder | 34.3 | 6.6 | 42.8 | ○ |
| Ex. 8 | 0.5 | 20 | — | — | — | — | remainder | 34.9 | 6.8 | 57.2 | ○ |
| Ex. 9 | 1.0 | 20 | 10 | — | — | — | remainder | 31.1 | 6.2 | 57.7 | ○ |
| Ex. 10 | 5.0 | 20 | 10 | — | — | — | remainder | 33.6 | 4.7 | 56.0 | ○ |
| Ex. 11 | 1.0 | 1 | 10 | — | — | — | remainder | 37.1 | 7.1 | 47.2 | ○ |
| Ex. 12 | 1.0 | 100 | 10 | — | — | — | remainder | 37.1 | 5.8 | 54.4 | ○ |
| Ex. 13 | 0.2 | 20 | — | 10 | — | — | remainder | 36.7 | 7.2 | 43.1 | ○ |
| Ex. 14 | 0.5 | 20 | — | — | — | — | remainder | 36.5 | 7.2 | 55.8 | ○ |
| Ex. 15 | 1.0 | 20 | — | 10 | — | — | remainder | 34.9 | 6.3 | 58.4 | ○ |
| Ex. 16 | 5.0 | 20 | — | 10 | — | — | remainder | 33.6 | 5.5 | 56.9 | ○ |
| Ex. 17 | 1.0 | 1 | — | 10 | — | — | remainder | 37.1 | 9.4 | 50.2 | ○ |
| Ex. 18 | 1.0 | 100 | — | 10 | — | — | remainder | 36.3 | 7.0 | 51.8 | ○ |
| Ex. 19 | 0.2 | 20 | — | — | 10 | — | remainder | 34.9 | 6.3 | 43.3 | ○ |
| Ex. 20 | 0.5 | 20 | — | — | — | — | remainder | 34.5 | 6.6 | 57.1 | ○ |

TABLE 2

| | Test conditions Composition | | | | | | | | Test results | | |
|---|---|---|---|---|---|---|---|---|---|---|---|
| | wt % | | wt ppm | | | | | Tail length (μm) | | High temperature bond strength | Ball |
| | Pd | Bi | Y | La | Ca | Be | Au | Average | Standard deviation | (gf) | appearance |
| Ex. 21 | 1.0 | 20 | — | — | 10 | — | remainder | 32.1 | 5.7 | 57.4 | ○ |
| Ex. 22 | 5.0 | 20 | — | — | 10 | — | remainder | 34.1 | 5.7 | 58.1 | ○ |
| Ex. 23 | 1.0 | 1 | — | — | 10 | — | remainder | 35.8 | 8.4 | 49.2 | ○ |
| Ex. 24 | 1.0 | 100 | — | — | 10 | — | remainder | 35.9 | 5.3 | 53.7 | ○ |
| Ex. 25 | 1.0 | 20 | 3 | — | — | — | remainder | 35.6 | 7.3 | 61.2 | ○ |
| Ex. 26 | 1.0 | 20 | 250 | — | — | — | remainder | 32.2 | 5.8 | 57.9 | ○ |
| Ex. 27 | 1.0 | 20 | — | 3 | — | — | remainder | 34.4 | 9.9 | 62.0 | ○ |
| Ex. 28 | 1.0 | 20 | — | 250 | — | — | remainder | 34.2 | 7.1 | 59.3 | ○ |
| Ex. 29 | 1.0 | 20 | — | — | 3 | — | remainder | 36.1 | 6.7 | 61.8 | ○ |
| Ex. 30 | 1.0 | 20 | — | — | 250 | — | remainder | 34.9 | 4.4 | 60.7 | ○ |
| Ex. 31 | 1.0 | 20 | — | — | — | 3 | remainder | 36.3 | 8.1 | 61.2 | ○ |
| Ex. 32 | 1.0 | 20 | — | — | — | 10 | remainder | 34.1 | 6.1 | 60.4 | ○ |
| Ex. 33 | 1.0 | 20 | — | — | — | 250 | remainder | 32.1 | 5.8 | 58.0 | ○ |
| Ex. 34 | 1.0 | 20 | 10 | 10 | — | — | remainder | 34.8 | 5.7 | 59.8 | ○ |
| Ex. 35 | 1.0 | 20 | 10 | — | 10 | — | remainder | 33.2 | 5.1 | 62.0 | ○ |
| Ex. 36 | 1.0 | 20 | 10 | — | — | 10 | remainder | 33.5 | 5.8 | 59.2 | ○ |
| Ex. 37 | 1.0 | 20 | — | 10 | 10 | — | remainder | 35.2 | 5.8 | 59.8 | ○ |
| Ex. 38 | 1.0 | 20 | — | 10 | — | 10 | remainder | 37.6 | 6.1 | 58.7 | ○ |
| Ex. 39 | 1.0 | 20 | — | — | 10 | 10 | remainder | 35.7 | 5.0 | 60.2 | ○ |
| Ex. 40 | 1.0 | 20 | 10 | 10 | 10 | — | remainder | 33.9 | 6.0 | 67.4 | ○ |
| Ex. 41 | 1.0 | 20 | 10 | 10 | 10 | 10 | remainder | 32.7 | 4.6 | 67.2 | ○ |

TABLE 3

| | Test conditions Composition | | | | | | | Test results | | | |
|---|---|---|---|---|---|---|---|---|---|---|---|
| | wt % | wt ppm | | | | | | Tail length (μm) | | High temperature bond strength | Ball |
| | Pd | Bi | Y | La | Ca | Be | Au | Average | Standard deviation | (gf) | appearance |
| Com. ex. 1 | — | — | — | — | — | — | remainder | 75.2 | 32.3 | 5.2 | ○ |
| Com. ex. 2 | — | 20 | — | — | — | — | remainder | 48.1 | 12.7 | 14.8 | ○ |
| Com. ex. 3 | 0.1 | 20 | — | — | — | — | remainder | 46.0 | 11.0 | 16.4 | ○ |
| Com. ex. 4 | 7.0 | 20 | — | — | — | — | remainder | 58.9 | 14.4 | 44.1 | ○ |
| Com. ex. 5 | 1.0 | — | — | — | — | — | remainder | 56.1 | 21.4 | 33.2 | ○ |
| Com. ex. 6 | 1.0 | 200 | — | — | — | — | remainder | 38.1 | 6.7 | — | × |
| Com. ex. 7 | — | 20 | 10 | — | — | — | remainder | 46.4 | 8.7 | 13.5 | ○ |
| Com. ex. 8 | — | 20 | — | — | — | 10 | remainder | 50.9 | 9.5 | 15.8 | ○ |
| Com. ex. 9 | 3.5 | — | — | 10 | — | — | remainder | 39.1 | 20.1 | 33.4 | ○ |

In accordance with the present invention, a novel gold alloy wire in which the prescribed amounts of Pd and Bi are added, especially suitable for forming a bump to an IC chip, is provided and the following effects are obtained.

1) The simple pull-derived tail can be stably formed with a short length. As a result, bumps can be stably formed by the simple pulling method and the reliability of a semiconductor device is advantageously improved.
2) The high temperature bond strength can be improved which is advantageous in increasing the reliability of a semiconductor device. If the prescribed amount of at least one of Y, La, Ca and Be is further added, the high temperature bond strength can be further improved which is further advantageous in increasing the reliability of a semiconductor device.

Further, by forming a bump using the above gold alloy wire and the simple pulling method, 1) a gold bump having a uniform tail length can be stably formed by a simple pulling operation, which is advantageous in improvement in the productivity, and
2) the high temperature bond strength can be improved which is advantageous in increasing the reliability of a semiconductor device.

Further, by forming a bump using the above gold alloy wire and the notched pulling method, 1) the tail length can be set to a desired length and therefore the tail length can be made more uniformly short, and
2) the high temperature bond strength can be improved which is advantageous in increasing the reliability of a semiconductor device.

Examples 42 to 47

A mixture of a high purity gold having a purity of 99.999% by weight with prescribed amounts of Pd and Bi was melted in a vacuum furnace and cast to obtain a gold alloy ingot having a composition as shown in Table 4, that is, 1.0% by weight of Pd and 30 ppm by weight of Bi. The ingot was cold worked by a groove roller drawing machine and intermediately annealed to obtain a final wire diameter of 30 μm. The wire was finally annealed to have an elongation of 4%.

Using an automatic wire bonder (UTC-50 type, Shinkawa K.K.), wire bonding was conducted to bond between 100 aluminum electrodes of an IC chip and lead frames with the above obtained gold alloy wire by a ultrasound and heat pressing bonding method.

The loop height of the above sample was measured using a measuring microscope (STM-MJS type, Olympus K.K.). The loop height was the height H from the top surface of the IC chip 11 to the highest point of the loop as shown in FIG. 4. 100 samples were measured for each Example and the average of the loop heights of the 100 samples was used as the loop height in Table 4.

Also, several hundreds samples for each Example were placed at 200° C. for 500 hours and the shearing strength was measured using a shear tester. The average of 50 samples was used as the high temperature bond strength in Table 4.

TABLE 4

| Composition | | | | | | | Results | |
|---|---|---|---|---|---|---|---|---|
| wt % | wt ppm | | | | | | Loop height | High temperature bond strength |
| Pd | Bi | Y | La | Ca | Be | Au | (μm) | (gf) |
| Ex. 42 | 1.0 | 30 | — | — | — | — | remainder | 84 | 67 |
| Ex. 43 | 1.0 | 1 | — | — | — | — | remainder | 110 | 61 |
| Ex. 44 | 1.0 | 30 | 50 | — | — | — | remainder | 88 | 68 |
| Ex. 45 | 1.0 | 30 | — | 50 | — | — | remainder | 87 | 68 |
| Ex. 46 | 1.0 | 30 | — | — | 50 | — | remainder | 92 | 65 |
| Ex. 47 | 1.0 | 30 | 20 | — | — | 10 | remainder | 90 | 68 |

It is noted that when conventional gold alloy wires are used, the loop height is typically more than about 170 μm and the high temperature bond strength is typically less than about 30 gf.

Thus, when a gold alloy wire of the present invention is used, the loop height can be substantially reduced and the high temperature bonding strength can be improved.

I claim:

1. A gold alloy wire in which 0.2 to 5.0% by weight of palladium (Pd) and 1 to 100 ppm by weight of bismuth (Bi) have been added to gold having a purity of at least 99.99% by weight.

2. The gold alloy wire according to claim 1 wherein said purity of said gold is at least 99.999% by weight.

3. The gold alloy wire according to claim 1 wherein said amount of Pd is in a range of 0.5 to 5.0% by weight.

4. The gold alloy wire according to claim 1 wherein said amount of Bi is in a range of 1 to 40 ppm by weight.

5. The gold alloy wire according to claim 1 wherein at least one element selected from the group consisting of yttrium (Y), lanthanum (La), calcium (Ca) and beryllium (Be) in an amount of 3 to 250 ppm by weight has been further added to said gold.

6. The gold alloy wire according to claim 5 wherein said amount of said at least one element is 3 to 70 ppm by weight.

7. The gold alloy wire according to claim 5 wherein at least three elements selected from the group consisting of yttrium (Y), lanthanum (La), calcium (Ca) and beryllium (Be) have been added to said gold.

8. The gold alloy wire according to claim 5 wherein at least yttrium (Y), lanthanum (La) and calcium (Ca) have been added to said gold.

9. The gold alloy wire according to claim 1 wherein said wire is suitable for use in forming a bump for a wireless bonding process.

10. The gold alloy wire according to claim 1 wherein said wire is suitable for use in a wire bonding process.

* * * * *